United States Patent
Hideo

(10) Patent No.: US 10,998,342 B2
(45) Date of Patent: May 4, 2021

(54) ARRAY SUBSTRATE AND MANUFACTURING METHOD THEREOF

(71) Applicant: Wuhan China Star Optoelectronics Technology Co., Ltd., Hubei (CN)

(72) Inventor: Hirayama Hideo, Shenzhen (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 362 days.

(21) Appl. No.: 16/082,642

(22) PCT Filed: Jan. 24, 2018

(86) PCT No.: PCT/CN2018/073972
§ 371 (c)(1),
(2) Date: Sep. 6, 2018

(87) PCT Pub. No.: WO2019/075950
PCT Pub. Date: Apr. 25, 2019

(65) Prior Publication Data
US 2020/0295052 A1  Sep. 17, 2020

(30) Foreign Application Priority Data
Oct. 20, 2017  (CN) .......................... 201710986111.8

(51) Int. Cl.
*H01L 27/12* (2006.01)

(52) U.S. Cl.
CPC ........ *H01L 27/1222* (2013.01); *H01L 27/127* (2013.01); *H01L 27/1251* (2013.01)

(58) Field of Classification Search
None
See application file for complete search history.

(56) References Cited

U.S. PATENT DOCUMENTS

| | | | |
|---|---|---|---|
| 2016/0307936 A1* | 10/2016 | Shin | H01L 27/1222 |
| 2017/0278869 A1* | 9/2017 | Hiramatsu | H01L 29/78675 |
| 2018/0040640 A1* | 2/2018 | Takahashi | H01L 27/1225 |

FOREIGN PATENT DOCUMENTS

| | | |
|---|---|---|
| CN | 102013432 A | 4/2011 |
| CN | 106409919 A | 2/2017 |

(Continued)

OTHER PUBLICATIONS

CN2017109861118_1ST Office Action.

*Primary Examiner* — Steven M Christopher
(74) *Attorney, Agent, or Firm* — Leong C. Lei

(57) ABSTRACT

An array substrate and a manufacturing method thereof are provided. The array substrate includes a first thin-film transistor and a second thin-film transistor formed on a base and spaced from each other by a predetermined distance and set in parallel. The first thin-film transistor includes, sequentially stacked on the base, a first active layer, a first gate insulation layer, a first gate electrode, an interlayer insulation layer, and first source/drain electrodes. The first source/drain electrodes are electrically connected with the first active layer. The second thin-film transistors includes, sequentially stacked on the base, a second gate electrode, a second gate insulation layer, a second active layer, an etch stop layer, and second source/drain electrodes. The first active layer and the second gate electrode are both formed of a poly-silicon material. The first gate electrode and the second active layer are both formed of an oxide semiconductor material.

6 Claims, 5 Drawing Sheets

(56) References Cited

FOREIGN PATENT DOCUMENTS

| | | | |
|---|---|---|---|
| CN | 106876412 A | 6/2017 |
| CN | 107078135 A | 8/2017 |
| JP | 2000004021 A | 1/2000 |
| JP | 2000294795 A | 10/2000 |

* cited by examiner

ARRAY SUBSTRATE AND MANUFACTURING METHOD THEREOF

CROSS REFERENCE TO RELATED APPLICATIONS

This application claims the priority of Chinese Patent Application No. 201710986111.8 filed on Oct. 20, 2017, titled "Array Substrate and Manufacturing Method Thereof", the disclosure of which is incorporated herein by reference in its entirety.

BACKGROUND OF THE INVENTION

1. Field of the Invention

The present invention relates to the field of display technology, and more particularly to the field of technology for manufacturing array substrates of display devices.

2. The Related Arts

Display screens have been increasingly widely used in electronic devices of various fields of production and living of human beings, such as the sector of consumer electronics including mobile phones, tablet computers, and desktop computers, the sector of household electronic devices including televisions, or the sector of public facility domain including outdoor advertisement.

The main-stream display screens that are currently available include liquid crystal displays (LCDs) and organic light emitting diode (OLED) displays. To improve the displaying performance of the displays, including both large-sized display screens for outdoor applications and small-sized display screens for electronic electronics applications, more and more people have devoted themselves to slim edge-frame designs. A slim edge-frame display device could effectively lower the areas of non-display zones of joint display screens and thus effectively increases a screen ratio and significantly improves overall displaying performance. Thus, slim edge frame is an issue to be addressed in the field of display devices.

SUMMARY OF THE INVENTION

To resolve the issue of slim edge frame, the present invention provides an array substrate having a relatively small size.

A manufacturing method of such an array substrate is also provided.

An embodiment of the present invention provides an array substrate, which comprises a first thin-film transistor and a second thin-film transistor that are arranged on a base to be spaced from each other by a predetermined distance and set in parallel. The first thin-film transistor comprises, sequentially stacked on the base, a first active layer, a first gate insulation layer, a first gate electrode, an interlayer insulation layer, and first source/drain electrodes. The first source/drain electrodes are electrically connected to the first active layer. The second thin-film transistor comprises, sequentially stacked on the base, a second gate electrode, a second gate insulation layer, a second active layer, an etch stop layer, and second source/drain electrodes. The first active layer and the second gate electrode are both formed of a poly-silicon material and the first gate electrode and the second active layer comprise an oxide semiconductor material.

An embodiment of the present invention provides a method for manufacturing a display panel, which comprises the following steps:

providing a base plate and forming a buffer layer on one side of the base plate;

forming and patterning a poly-silicon layer on a surface of the buffer layer to form a first active layer and a second gate electrode that are spaced from each other by a predetermined distance;

forming an insulation layer on the first active layer and the second gate electrode to cover the first active layer and the second gate electrode, the insulation layer comprising a first gate insulation layer and a second gate insulation layer;

forming and patterning an oxide semiconductor material layer on the first gate insulation layer and the second gate insulation layer, wherein a portion of the oxide semiconductor material layer that corresponds to and covers the first gate insulation layer forms a first gate electrode; and a portion of the oxide semiconductor material layer that corresponds to and covers the second gate insulation layer forms a second active layer;

forming an insulation layer on the first gate electrode and the second active layer, wherein a portion of the insulation layer that corresponds to the first gate electrode forms an interlayer insulation layer and a portion of the insulation layer that corresponds to the second active layer forms an etch stop layer; and forming and patterning a metal layer on the interlayer insulation layer and the etch stop layer, wherein first source/drain electrodes are formed at locations corresponding to the first gate electrode and the first source/drain electrodes are electrically connected to the first active layer, wherein the first active layer, the first gate insulation layer, the first gate electrode, the interlayer insulation layer, and the first source/drain electrodes collectively form a first thin-film transistor; and second source/drain electrodes are formed at locations corresponding to the second gate electrode and the second source/drain electrodes are electrically connected to the second active layer, wherein the second gate electrode, the second gate insulation layer, the second active layer, the etch stop layer, and the second source/drain electrodes collectively form a second thin-film transistor.

Different from the prior art, the first thin-film transistor and the second thin-film transistor are formed simultaneously so that there is no need for conducting separate fabrication of the second thin-film transistor arranged in a driving circuit thereby improving the manufacturing efficiency.

Further, the second thin-film transistor that comprises an active layer formed of an oxide semiconductor has a channel that is of a relatively small size so that in each pixel, the thin-film transistor occupies a reduced amount of space to thereby effectively increase a size of a display area of a display panel and increase an aperture ratio. Also, in a non-display area, the poly-silicon made first thin-film transistor is provided as a switching thin-film transistor of the driving circuit so that the scan driver circuit or the data driver circuit is made small in size and fast in response thereby reducing the size of the non-display area to achieve the purpose of increasing the screen to surface ratio and slimming the edge frame.

BRIEF DESCRIPTION OF THE DRAWINGS

To more clearly explain the technical solution of the present invention, a brief description of the drawings that are necessary for embodiments of the present invention is given

DETAILED DESCRIPTION OF THE PREFERRED EMBODIMENTS

A clear and complete description will be given below to technical solutions provided by embodiments of the present invention with reference to the attached drawings of the embodiments of the present invention. However, the embodiments described are only some, but not all, of the embodiments of the present invention. Other embodiments that are available to those having ordinary skills of the art based on the embodiment of the present invention, without the expense of creative effort and endeavor, are considered belonging to the scope of protection of the present invention.

A specific embodiment of an array substrate of the present invention will be described with reference to the attached drawings.

Figure 1:
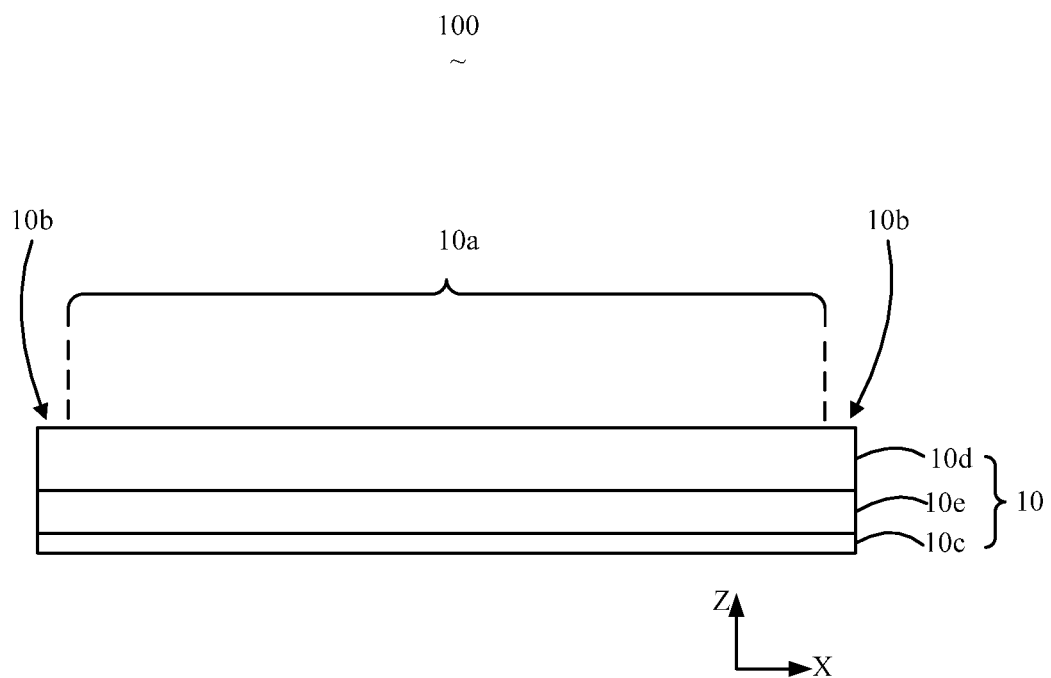
FIG. 1 is a schematic view illustrating a structure of a display device according to an embodiment of the present invention.

Referring to FIG. 1, FIG. 1 is a schematic view illustrating a structure of a display device according to an embodiment of the present invention. As shown in FIG. 1, the display device 100 comprises a display panel 10 and other auxiliary structures (not shown), wherein the auxiliary structures illustrated comprise an enclosure and a supporting structure.

The display panel 10 comprises an image display area 10a for displaying an image and a non-display area 10b. The display area 10a serves to display an image and the non-display area 10b surrounds a periphery of the display area 10a to serve as a non-light-emitting zone and does not display an image. The display panel 10 further comprises an array substrate 10c and an opposite substrate 10d, and a display medium layer 10e interposed and arranged between the array substrate 10c and the opposite substrate 10d. In the instant embodiment, the display medium comprises an organic electroluminescence diode (OLED). Certainly, in other alternative embodiments of the present invention, the display panel 10 of the display device 100 may comprise a display medium of a liquid crystal material, but not limited thereto. For easy illustration, a three-dimensional Cartesian coordinate system defined by a first direction X, a second direction Y, and a third direction Z that are mutually perpendicular to each other is first provided, wherein a thickness direction of the display device 100 is in the third direction Z.

Figure 2:
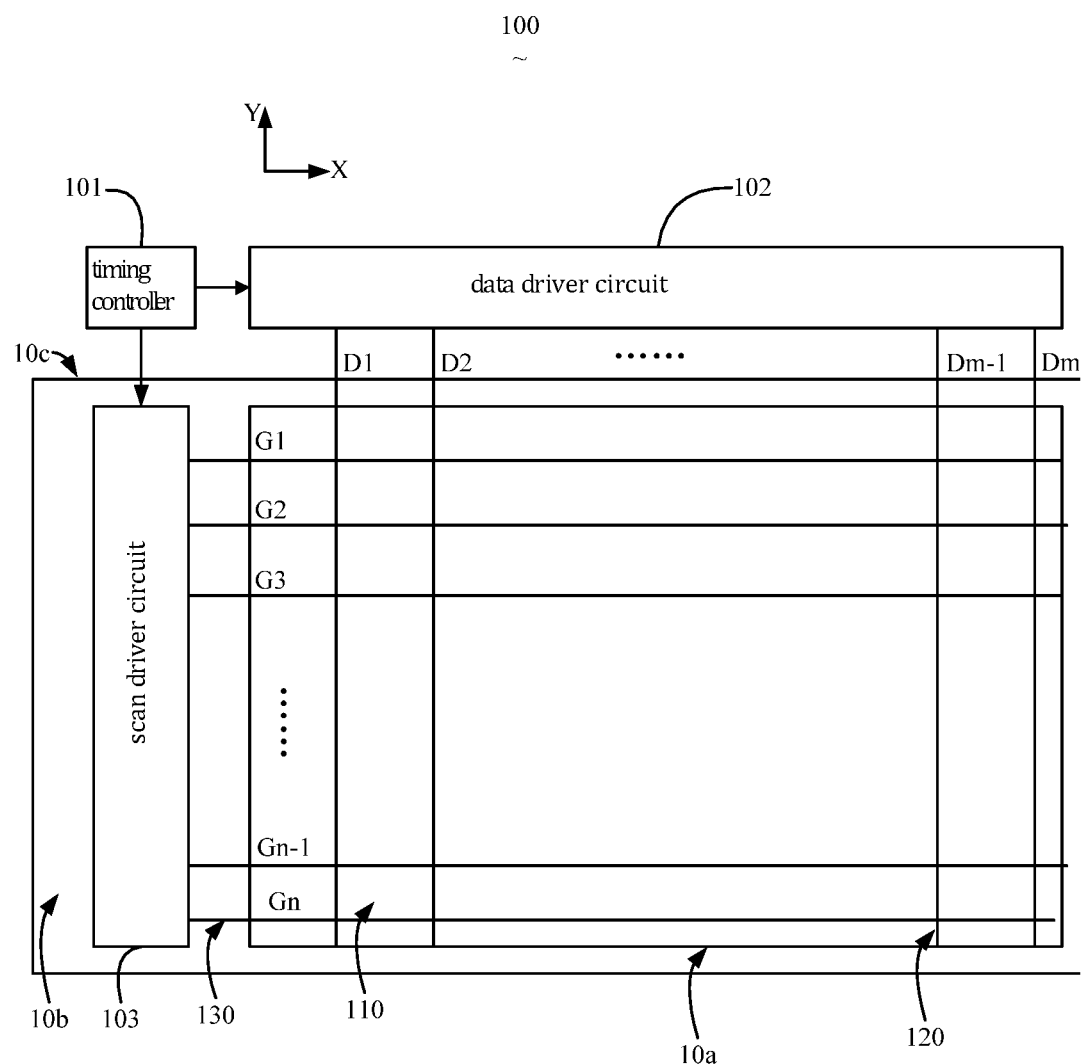
FIG. 2 is a schematic planar view illustrating a structure of an array substrate of a display panel shown in FIG. 1.

Referring to FIG. 2, which is a schematic planar view illustrating a structure of the array substrate 10c of the display panel 10 shown in FIG. 1, as shown in FIG. 2, the array substrate 10c has a first area (not labeled) that corresponds to the image display area 10a and comprises a plurality of pixels arranged in an m*n array 110, m data lines 120, and n scan lines 130, where m and n are each a natural number that is greater than 1.

The plurality of data lines 120 are arranged at intervals of a first predetermined distance to be spaced from each other in the first direction Y so as to be insulated from and parallel with each other. The plurality of scan lines 130 are arranged at intervals of a second predetermined distance to be spaced from each other in the second direction X so as to be insulated from and parallel with each other. Further, the plurality of scan lines 130 and the plurality of data lines 120 are insulated from each other, and the first direction X and the second direction Y are mutually perpendicular. For easy illustration, the m data lines 120 are respectively defined as D1, D2, . . . , Dm−1, and Dm; and the n scan lines 130 are respectively defined as G1, G2, . . . , Gn−1, and Gn. The plurality of pixels 110 are respectively located in the array defined by the plurality of data lines 120 and the scan lines 130 and are electrically connected with the data line 120 and the scan line 130 corresponding thereto.

Corresponding to the non-display area 10b of the display panel 10, the display device 100 (FIG. 1) further comprises, arranged in the non-display area 10b, a control circuit 101, a data driver circuit 102, and a scan driver circuit 103 that are provided for driving the plurality of arrayed pixels 110 to display an image and are arranged in a second area (not labeled) of the array substrate 11c. The data driver circuit 102 is electrically connected to the plurality of data lines 120 to transmit image data to be displayed, in the form of data voltages, through the plurality of data lines 120 to the plurality of pixels 110. The scan driver circuit 103 is electrically connected with the plurality of scan lines 130 to supply, through the plurality of scan lines 130, a scan signal for controlling the time when the pixels 110 receives image data to display an image. The control circuit 101 is electrically connected with the data driver circuit 102 and the scan driver circuit 103 to control operation timing of the data driver circuit 102 and the scan driver circuit 103, namely supplying corresponding timing control signals to the data driver circuit 102 and the scan driver circuit 103.

In the instant embodiment, the scan driver circuit 103 is directly set in the non-display area 10b of the display panel 10, while the control circuit 101 and the data driver circuit 102 are independently of the array substrate 10c and are set on other carrying circuit boards. In the instant embodiment, electronic components of the scan driver circuit 103 are formed, through the same manufacturing operation as that of the pixels 110 of the display panel 10, on the display panel 10, namely the so-called GOA (Gate on Array) technology.

Figure 3:
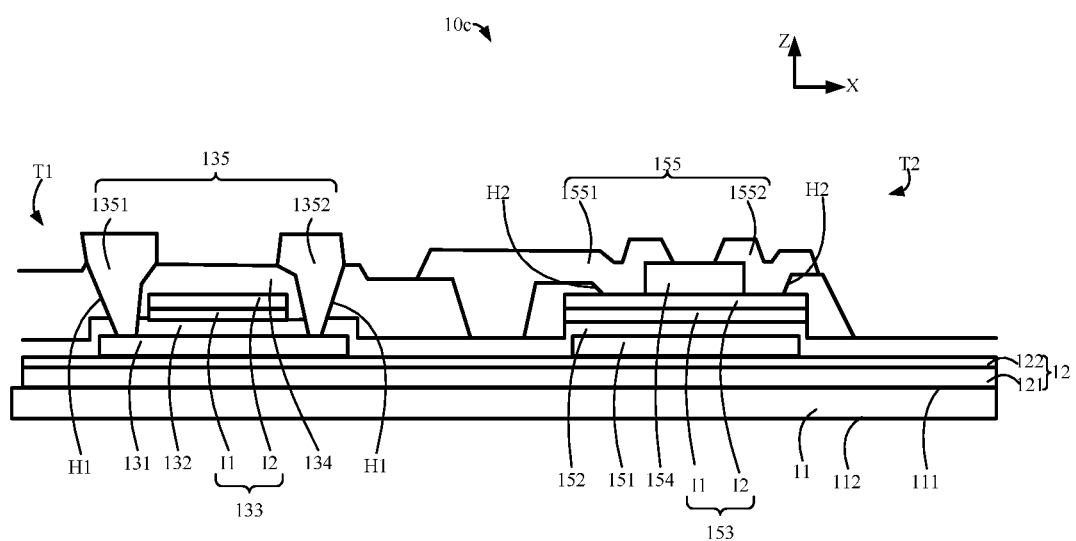
FIG. 3 is a schematic view illustrating a sideways structure of the array substrate shown in FIGS. 1 and 2.

Referring to FIG. 3, a schematic view illustrating a sideways structure of the array substrate shown in FIGS. 1 and 2 is provided.

As shown in FIG. 3, the array substrate 10c comprises a base 11. The base 11 is formed of a material of transparent glass or plastics. The base 11 has a first surface 111 and a second surface 112 that are opposite to each other. The first surface 111 are formed with a first thin-film transistor T1 and a second thin-film transistors T2 that are spaced from each other in the first direction X by a predetermined distance and are set in parallel. The first direction X and the second direction Y are both parallel to the plane on which the base 11 is located.

It is noted that in the instant embodiment, the first thin-film transistor T1 is a low temperature poly-silicon (LTPS) active layer based thin-film transistor and the second thin-film transistors T2 is an oxide semiconductor based thin-film transistor, such as a thin-film transistor comprising an active layer formed of indium gallium zinc oxide (IGZO).

The first thin-film transistors T1 is arranged in the scan driver circuit 103 or the data driver circuit 102 to conduct scanning or supplying of a data signal to each of the pixels 110 of the display area 10a. The second thin-film transistors T2 is arranged in each of the pixels 110 and is electrically connected to a pixel electrode Px to drive the pixel electrode Px to display an image.

The base 11 is provided thereon with a buffer layer 12. The buffer layer 12 comprises a first sub buffer layer 121 and a second sub buffer layer 122 stacked, in sequence, in the third direction Z, meaning the first buffer layer 121 is arranged on the first surface 111 of the base 11 and the second sub buffer layer 122 is arranged on a surface of the first sub buffer layer 121 that is distant from the first surface 111. The first sub buffer layer 121 comprises a silicon oxide (SiOx) film, and the second sub buffer layer comprises a silicon nitride (SiNx) film.

Specifically, the stack of the silicon nitride and silicon oxide films has a thickness of 50-100 nm. Also, a ratio between thicknesses of the silicon nitride layer and the silicon oxide layer is 1-1.5:0.8-1.6. For example, the ratio of the thicknesses of the silicon nitride layer and the silicon oxide layer is 1:1. For example, the silicon oxide layer has a thickness of 20-60 nm. A reactant gas that is used to form the SiNx film comprises a mixture gas of $SiH_4$, $NH_3$, and $N_2$, or a mixture gas of $SiH_2Cl_2$, $NH_3$, and $N_2$; and a reactant gas that is used to form the SiOx film comprises a mixture gas of $SiH_4$ and $N_2O$ or a mixture gas of $SiH_4$ and ethyl silicate (TEOS).

The first thin-film transistor T1 comprises, sequentially stacked on a surface of the buffer layer 12 in the third direction Z, a first active layer 131, a first gate insulation layer 132, a first gate electrode 133, an interlayer insulation layer 134, and first source/drain electrodes 135, wherein the first source/drain electrodes 135 are respectively and electrically connected, through first through holes H1, to the first active layer 131. Specifically, the first source/drain electrodes 135 comprise a first source electrode 1351 and a first drain electrode 1352 that are respectively arranged on two sides of the first gate electrode 133 in the first direction X and are respectively and electrically connected, through the two first through holes H1, to the opposite side portions of the first active layer 131 in the first direction X. The second thin-film transistor T2 comprises, sequentially stacked on a surface of the buffer layer 12 in the third direction Z, a second gate electrode 151, a second gate insulation layer 152, a second active layer 153, an etch stop layer 154, and second source/drain electrodes 155. Specifically, the etch stop layer 154 is set on and covers the second active layer 153 and is formed with second through holes H2 respectively corresponding to two opposite side portions of the second active layer 153 in the first direction X. Correspondingly, the second source/drain electrodes 155 comprise a second source electrode 1551 and a second drain electrode 1552 that are spaced from each other by a predetermined distance in the first direction X and are respectively and electrically connected, through the two second through holes H2, to the second active layer 153.

Preferably, the first active layer 131 and the second gate electrode 151 are located in the same layer structure and are formed in the same manufacturing operation and are of materials that are both low temperature poly-silicon (p-Si). Preferably, the poly-silicon material of the first active layer 131 comprises channel dopants so as to provide the first thin-film transistor T1 with characteristics of fast cutting off; the poly-silicon material of the second gate electrode 151 comprises conductive dopants so as to provide the second thin-film transistor T2 with better electrical conductivity.

Preferably, the first gate electrode 133 and the second active layer 153 both comprise a first oxide semiconductor layer I1 and a second oxide semiconductor layer I2 arranged adjacent to each other, wherein the first oxide semiconductor layer I1 is in a direction closer to the base 11 than the second oxide semiconductor layer I2. In the instant embodiment, the first oxide semiconductor layer I1 is formed of a material comprising indium gallium zinc oxide (IGZO), and the second oxide semiconductor layer I2 is formed of a material comprising indium tin oxide (ITO).

The second active layer 153 is formed of an oxide semiconductor material so that the second thin-film transistor T2 so formed is a IGZO/ITO thin-film transistor, which serves as a driver thin-film transistor of the pixels 110 (FIG. 2). Since a IGZO thin-film transistor has a small size and volume and has a threshold voltage Vth of relatively high stability so that the second thin-film transistor T2 possesses better stability. The interlayer insulation layer 134 and the etch stop layer 154 are located on the same layer structure and are formed in the same manufacturing operation and are both formed of a silicon oxide (SiOx) material or silicon nitride (SiNx).

The first source/drain electrodes 135 and the second source/drain electrodes 155 are both formed of a metallic material comprising aluminum or titanium. The first source/drain electrodes 135 and the second source/drain electrodes 155 are formed through patterning an aluminum or titanium metal layer that is formed on a surface of the interlayer insulation layer 134 and the etch stop layer 154.

Preferably, the first active layer 131 comprises a phosphor (P) doped poly-silicon material so that the first thin-film transistors T1 is structured as a top-gate P type thin-film transistor. The second active layer 154 comprises a nitrogen (N) doped oxide semiconductor so that the second transistor T2 is structured as a bottom-gate N type thin-film transistor.

Different from the prior art, the first thin-film transistor T1 of the pixel 110 that functions for driving and the second thin-film transistor T2 that is arranged in the driving circuit provided in the non-display area 10b are formed simultaneously so that there is no need for conducting separate fabrication of the second thin-film transistor T2 arranged in the driving circuit thereby improving the manufacturing efficiency.

Also, the second thin-film transistor T2 that comprises an active layer formed of an oxide semiconductor has a channel that is of a relatively small size so that in each of the pixels, the thin-film transistor occupies a reduced amount of space to thereby effectively increase the size of the display area 10a of the display panel 10 and increase the aperture ratio. Also, in the non-display area 10b, the poly-silicon made first thin-film transistor T1 is provided as a switching thin-film transistor of the driving circuit so that the scan driver circuit or the data driver circuit is made small in size and fast in response thereby reducing the size of the non-display area 10b to achieve the purpose of increasing the screen to surface ratio and slimming the edge frame.

Figure 4:
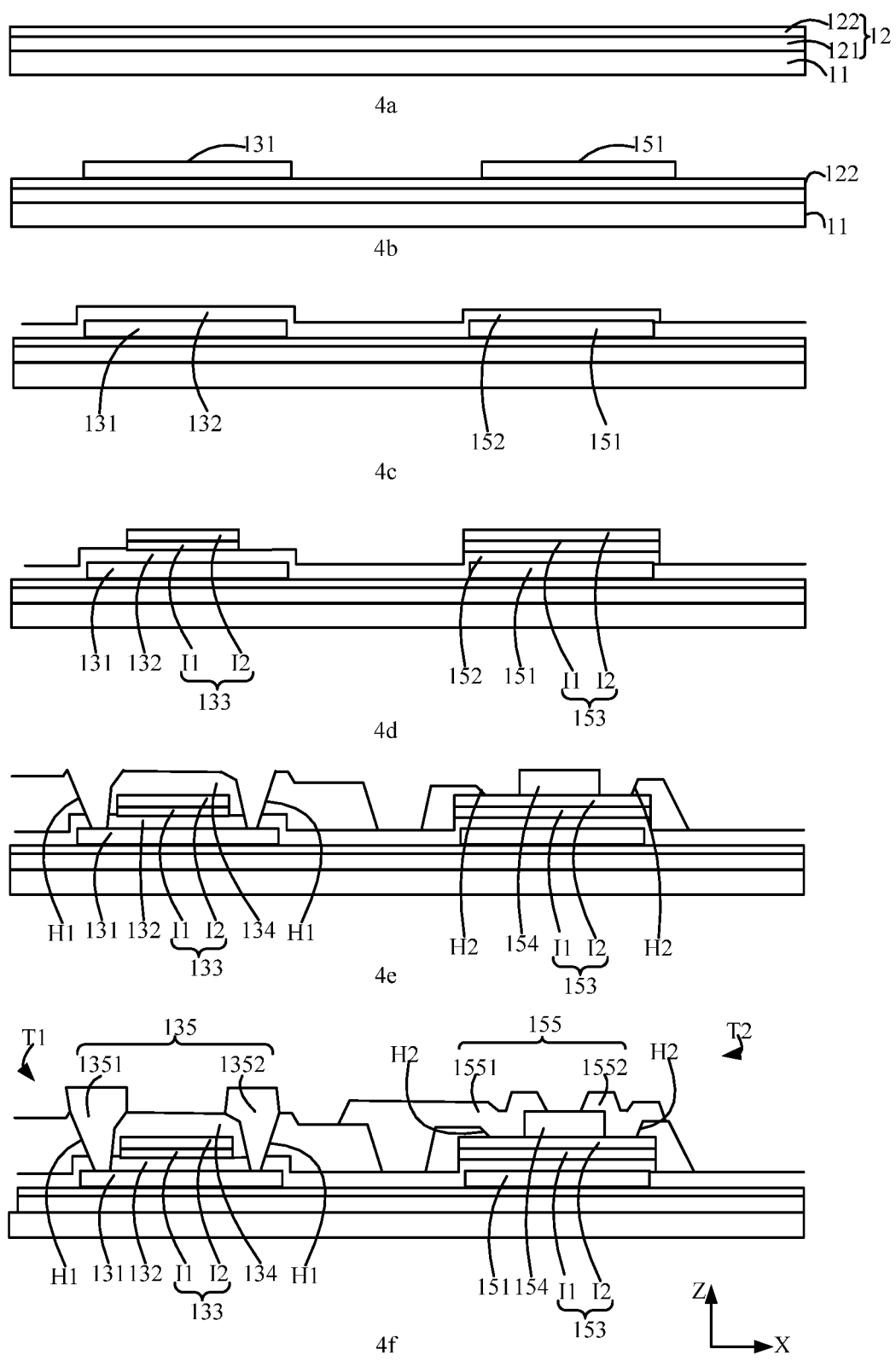
FIG. 4 is is a schematic view showing a sideways structure corresponding to each step of a manufacturing method of an array substrate shown in FIG. 3.
Figure 5:
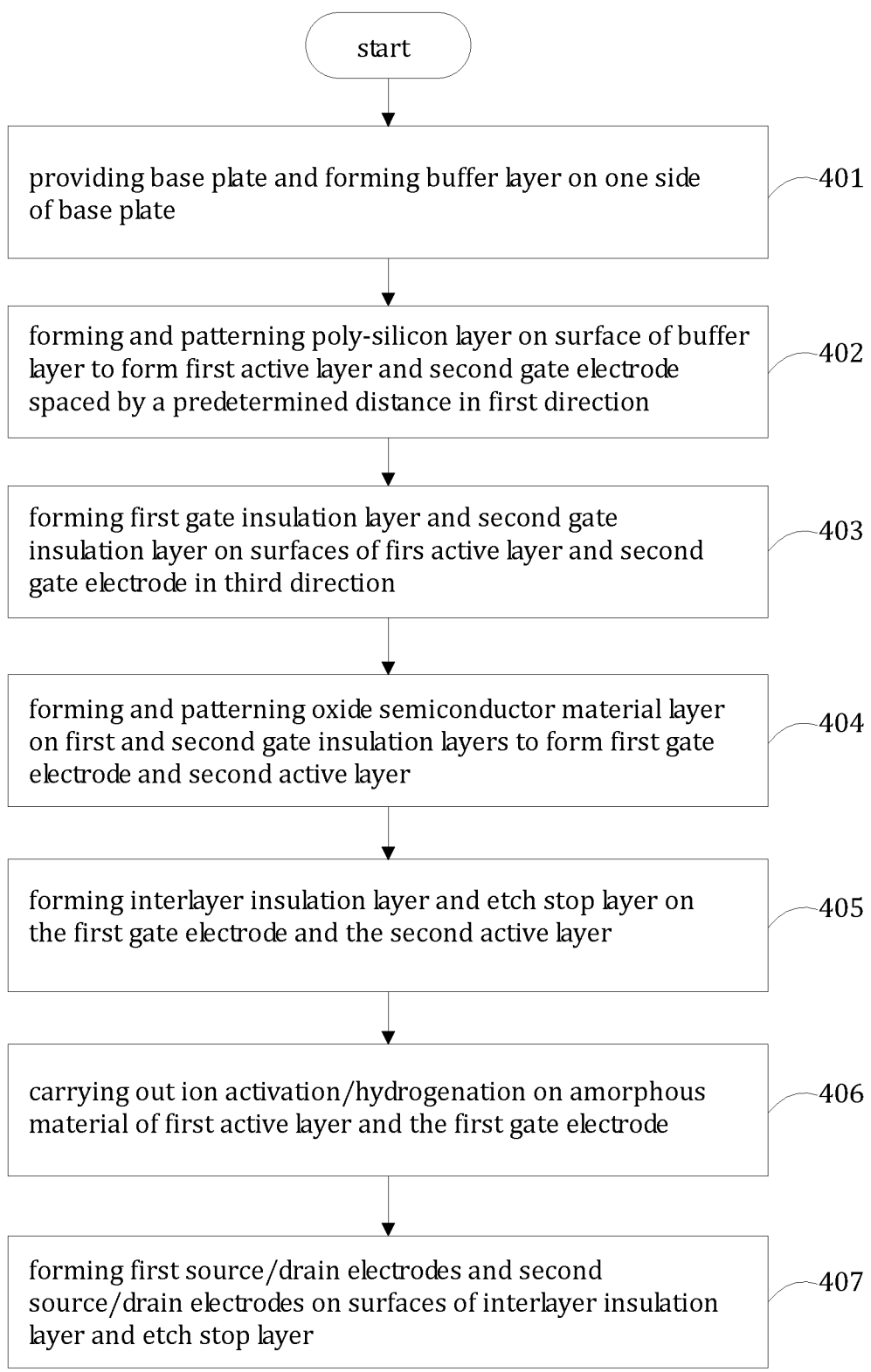
FIG. 5 is a flow chart illustrating the manufacturing method of the array substrate shown in FIG. 3.

Referring to FIG. 4, a schematic view showing a sideways structure corresponding to each step of a manufacturing method of the array substrate 10c shown in FIG. 3 is provided. FIG. 5 is a flow chart illustrating the manufacturing method of the array substrate shown in FIG. 3. A description to the manufacturing steps of the array substrate 10c will be provided below with reference to FIGS. 3-5.

Step 401, as shown in part 4a of FIG. 4, providing a base plate 11 and forming a buffer layer 12 on a first surface 111 that is on one side of the base plate 11.

Preferably, plasma enhanced chemical vapor deposition (PECVD) is applied to deposit a film of the first sub buffer layer 121 and the second sub buffer layer 122, which is of a predetermined thickness, on the first surface of the base 11. For example, the predetermined thickness is 50-100 nm. The material of deposition for the first sub buffer layer 121 can be a silicon oxide (SiOx) film, and the material of deposition for the second sub buffer layer 122 can be a silicon nitride (SiNx) film. Step 402, as shown in part 4b of FIG. 4, forming a poly-silicon layer on a surface of the second sub buffer layer 122 and conducting patterning to form a first active layer 131 and a second gate electrode 151, which are spaced by a predetermined distance in a first direction X.

Specifically, after DGH washing and cleaning has been conducted on the base plate 11 that comprises the buffer layer 12 deposited thereon, a plasma enhanced chemical vapor deposition operation is applied to deposit an amorphous silicon layer on a surface of the buffer layer 12 that is distant from the base plate and then, irradiation with laser, excimer laser anneal (ELA), and photolithography are carried out such that the amorphous silicon layer is converted into a poly-silicon layer, wherein deposition temperature is generally controlled to be below 500° C. and the thickness of the amorphous silicon layer is 40 nm-50 nm. Certainly, the thickness can be properly selected according to a specific operation involved.

The poly-silicon layer is then subjected to doping and patterning, wherein patterning is accomplished with dry etching and stripping operations.

Next, CD ion implantation doping (CD IMP) is applied to adopt B implantation in the poly-silicon layer to carry out channel doping. In other words, boron ions that demonstrate characteristics of semiconductors is doped into the poly-silicon layer and NP photolithography and annealing operations are applied to treat the doped poly-silicon layer to form a first active layer 131. As such, the poly-silicon material of the first active layer 131 comprises channel dopant so as to provide a first thin-film transistor T1 with characteristics of fast cutting off.

NP ion implantation doping (NP IMP) is applied to adopt B implantation in the poly-silicon layer to carry out conductor doping. In other words, a substance that demonstrates characteristics of semiconductors is doped into the poly-silicon layer to form a second gate electrode 151. As such, the poly-silicon material of the second gate electrode 151 comprises conductor dopant so as to provide a second thin-film transistor T2 with better electrical conductivity. Patterning is a pattern-forming operation that carries out etching on a portion of the poly-silicon layer to have the poly-silicon layer formed with patterned first active layer 131 and second gate electrode 151. Preferably, after the formation of the first active layer 131 and the second gate electrode 151, ashing and stripping operations are carried out thereon. In the instant embodiment, etching of the poly-silicon layer can be carried out with a known wet etching process or dry etching process.

Step 403, as shown in part 4c of FIG. 4, forming, in the third direction Z, an insulation layer on surfaces of the first active layer 131 and the second gate electrode 151 such that the insulation layer forms a first gate insulation layer 132 and a second gate insulation layer 152. In other words, a portion of the insulation layer corresponding in location to the first active layer 131 forms the first gate insulation layer 132, and a portion corresponding in position to the second gate electrode 151 forms the second gate insulation layer 152.

Specifically, a silicon nitride (SiNx) and/or silicon oxide (SiOx) film having a predetermined thickness is deposited on surfaces of the first active layer 131 and the second gate electrode 151 through a chemical vapor deposition (CVD) operation. Preferably, before the formation of the insulation layer on the surfaces of the first active layer 131 and the second gate electrode 151, DHF washing is applied to the first active layer 131 and the second gate electrode 151, and after the formation of the insulation layer on the surfaces of the first active layer 131 and the second gate electrode 151, ashing and cleaning are applied.

Step 404, as shown in part 4d of FIG. 4, forming and patterning an oxide semiconductor material layer on the first gate insulation layer 132 and the second gate insulation layer 152, wherein a portion of the oxide semiconductor material layer that corresponds to and covers the first gate insulation layer 132 forms a first gate electrode 133; and a portion of the oxide semiconductor material layer that corresponds to and covers the second gate insulation layer 152 forms a second active layer 153.

In the instant embodiment, preferably, the first gate electrode 133 and the second active layer 153 both comprise a first oxide semiconductor layer I1 and a second oxide semiconductor layer I2 that are arranged adjacent to each other, wherein the first oxide semiconductor layer I1 is in a direction closer to the base 11 than the second oxide semiconductor layer I2. In the instant embodiment, the first oxide semiconductor layer I1 is formed of a material comprising indium gallium zinc oxide (IGZO), and the second oxide semiconductor layer I2 is formed of a material comprising indium tin oxide (ITO).

Specifically, a IGZO material is formed, through sputtering, on surfaces of the first gate insulation layer 132 and the second gate insulation layer 152 to form a IGZO film, and then, a ITO material is deposited on a surface of the IGZO film to form a ITO film. And, then, a pattern-forming operation is applied to pattern the IGZO film and the ITO film to form the first oxide semiconductor layer I1 and the second oxide semiconductor layer I2, wherein the first gate electrode 133 that corresponds to the first active layer 131 and comprises the first oxide semiconductor layer I1 and the second oxide semiconductor layer I2 functions as a conductive electrode; and the second active layer 153 that corresponds to the second gate electrode 151 and comprises the first oxide semiconductor layer I1 and the second oxide semiconductor layer I2 functions as a conductive channels.

Preferably, after the formation of the first gate electrode 133, ion implantation is applied to form source and drain zones in the first active layer 131 and respectively corresponding to two opposite sides of the first gate electrode 133 in the first direction X.

Preferably, patterning is accomplished through dry etching and stripping operations and after the formation of the first gate electrode 133 and the second active layer 153, activation anneal and cleaning operations are carried out. Step 405, as shown in part 4e of FIG. 4, forming an insulation layer on the first gate electrode 133 and the second active layer 153, wherein a portion of the insulation layer that corresponds to the first gate electrode 133 forms an interlayer insulation layer 134 and a portion of the insulation layer that corresponds to the second active layer 153 forms an etch stop layer 154.

Specifically, a CVD process is applied to deposit a silicon oxide (SiOx) or silicon nitride (SiNx) film having a predetermined thickness on surfaces of the first gate insulation layer 132, the first gate electrode 133, the second gate insulation layer 152, and the second active layer 153 that are distant from the base plate 11 to serve as the insulation layer. Certainly, the portion of the insulation layer corresponding to the first gate electrode 133 forms the interlayer insulation layer 134, and the portion of the insulation layer corresponding to the second active layer 153 forms the etch stop layer 154.

Preferably, after the formation of the etch sop layer 154 on the second active layer 153, ion implantation is applied to form source and drain zones in the second active layer 154 and respectively corresponding to two opposite sides of the second gate electrode 151 in the first direction X.

Also, it is noted that after being formed, the interlayer insulation layer 134 is subsequently subjected to dry etching or wet etching to form first through holes H1 at locations respectively corresponding to the source and drains areas of the first active layer 131 corresponding to two opposite sides of the first gate electrode 133 in the first direction X and the through holes extend through the interlayer insulation layer 134 and the first gate insulation layer 132, so as to have portions of the first active layer 131 exposed through the first through holes H1. After being formed, the etch stop layer 154 is subsequently subjected to formation of the second through holes H2 at locations respectively corresponding to the source and drains areas of the second active layer 153 respectively at two opposite sides in the first direction X and the through holes extend through the etch stop layer 154 to have portions of the second active layer 153 exposed through the second through holes H2.

Preferably, after the formation of the interlayer insulation layer 134 and the etch stop layer 154, a hydrogenation anneal operation carried out to fix defects and solidified grain boundary of the poly-silicon material of the first active layer 131 and the second gate electrode 151.

Step 406, as shown in part 4f of FIG. 4, forming and patterning, through dry etching or wet etching an aluminum or titanium metallic layer on the interlayer insulation layer 134 and the etch stop layer 155, wherein first source/drain electrodes 135 are formed at locations corresponding to two sides of the first gate electrode in the first direction X and the first source/drain electrodes 135 are electrically connected through the first through holes H1 to the first active layer 131. As such, the first active layer 131, the first gate insulation layer 132, the first gate electrode 133, the interlayer insulation layer 134, and the first source/drain electrodes 135 collectively form a first thin-film transistor T1.

Second source/drain electrodes 155 are formed at locations corresponding to two sides of the second gate electrode 151 in the first direction X and the second source/drain electrodes 155 are electrically connected, through the second through holes H2, to the second active layer 153. The second gate electrode 151, the second gate insulation layer 152, the second active layer 153, the etch stop layer 154, and the second source/drain electrodes 155 collectively form a second thin-film transistor T2. It is appreciated that a pixel electrode (not shown) may subsequently be formed on the second source/drain electrodes 135, wherein the second source electrode 1351 or the second drain electrode 1352 is electrically connected with the pixel electrodes (not shown).

The embodiments described above are not construed as constraining to the scope of protection of the technical solutions so provided. Modifications, equivalent substitutes, and improvements within the spirit and principle of the above-described embodiments are considered belonging the scope of protection of those technical solutions.

What is claimed is:

1. An array substrate, comprising a first thin-film transistor and a second thin-film transistor that are arranged on a base to be spaced from each other by a predetermined distance and set in parallel, wherein:

the first thin-film transistor comprises, sequentially stacked on the base, a first active layer, a first gate insulation layer, a first gate electrode, an interlayer insulation layer, and first source/drain electrodes, the first source/drain electrodes being electrically connected to the first active layer;

the second thin-film transistor comprises, sequentially stacked on the base, a second gate electrode, a second gate insulation layer, a second active layer, an etch stop layer, and second source/drain electrodes; and the first active layer and the second gate electrode are both formed of a poly-silicon material and the first gate electrode and the second active layer comprise an oxide semiconductor material;

wherein the first gate electrode and the second active layer both comprise a first oxide semiconductor layer and a second oxide semiconductor layer that are arranged adjacent to each other, and the first oxide semiconductor layer is located closer to the base than the second oxide semiconductor layer, the first oxide semiconductor layer being formed of a material comprising indium gallium zinc oxide, the second oxide semiconductor layer being formed of a material comprising indium tin oxide.

2. The array substrate according to claim 1, wherein the base has a surface on which a buffer layer is further provided, the first active layer and the second gate electrode being both arranged on a surface of the buffer layer that is distant from the base.

3. The array substrate according to claim 1, wherein the first active layer and the second gate electrode are located in a structure of the same layer and are formed in the same fabrication operation, the poly-silicon material of the first active layer comprising channel dopants, the poly-silicon material of the second gate electrode comprising conductor dopants.

4. The array substrate according to claim 3, wherein the interlayer insulation layer and the second gate insulation layer are both formed of a silicon oxide material and the interlayer insulation layer and the second gate insulation layer are located in a structure of the same layer and are formed in the same fabrication operation.

5. The array substrate according to claim 4, wherein the first gate insulation layer and the second gate insulation layer are arranged on the same layer and are jointed to each other to form a single insulation layer that covers the first active layer and the second gate electrode.

6. The array substrate according to claim 1, wherein the first thin-film transistor comprise a P type thin-film transistor and the second thin-film transistor comprises an N type thin-film transistor, the second thin-film transistor being directly connected to a pixel electrode for image displaying to drive the pixel electrode to carry out image displaying.

* * * * *